(12) United States Patent
Gommershtadt et al.

(10) Patent No.: US 11,797,735 B1
(45) Date of Patent: Oct. 24, 2023

(54) REGRESSION TESTING BASED ON OVERALL CONFIDENCE ESTIMATING

(71) Applicant: Synopsys, Inc., Mountain View, CA (US)

(72) Inventors: Boris Gommershtadt, Zion (IL); Leonid Greenberg, LeZion (IL); Ilya Kudryavtsev, Yakov (IL); Yaron Shkedi, Herzliya (IL)

(73) Assignee: Synopsys, Inc., Mountain View, CA (US)

( * ) Notice: Subject to any disclaimer, the term of this patent is extended or adjusted under 35 U.S.C. 154(b) by 420 days.

(21) Appl. No.: 17/194,147

(22) Filed: Mar. 5, 2021

Related U.S. Application Data

(60) Provisional application No. 62/986,048, filed on Mar. 6, 2020.

(51) Int. Cl.
| | |
|---|---|
| *G06F 30/327* | (2020.01) |
| *G06F 30/3308* | (2020.01) |
| *G06F 30/3323* | (2020.01) |
| *G06F 30/398* | (2020.01) |
| *G06F 30/367* | (2020.01) |
| *G06F 17/18* | (2006.01) |
| *G06N 7/00* | (2023.01) |
| *G06N 7/01* | (2023.01) |

(52) U.S. Cl.
CPC .......... *G06F 30/327* (2020.01); *G06N 7/01* (2023.01); *G06F 17/18* (2013.01); *G06F 30/3308* (2020.01); *G06F 30/3323* (2020.01); *G06F 30/367* (2020.01); *G06F 30/398* (2020.01)

(58) Field of Classification Search
CPC ............... G06F 30/327; G06F 30/3308; G06F 30/3323; G06F 30/398; G06F 30/367; G06F 17/18; G06N 7/01
USPC ............ 716/106, 104, 112, 136; 703/14, 20; 714/25, 33, 724, 741
See application file for complete search history.

(56) References Cited

U.S. PATENT DOCUMENTS

| | | | | |
|---|---|---|---|---|
| 6,728,203 | B2 * | 4/2004 | Wang ................... | H04B 7/0845 370/335 |
| 7,756,810 | B2 * | 7/2010 | Nelken .................. | G06F 16/20 706/60 |
| 8,495,002 | B2 * | 7/2013 | Nelken .................. | G06N 5/022 706/62 |
| 8,739,009 | B1 * | 5/2014 | Varnica ............... | H03M 13/373 714/795 |

(Continued)

*Primary Examiner* — Phallaka Kik
(74) *Attorney, Agent, or Firm* — Haynes Beffel & Wolfeld LLP; Andrew L. Dunlap

(57) ABSTRACT

A method of testing a product using confidence estimates is provided. The method includes identifying a set of candidate tests and estimating a respective confidence score for each candidate test, the confidence scores reflecting a level of confidence that the corresponding candidate tests will pass or fail when being performed on the product, the estimating including determining the respective confidence scores in dependence upon at least one of (i) previously obtained test results, (ii) changes to the product since a previous estimation or regression test has been performed and (iii) information regarding a user. The method includes identifying a candidate test having a confidence score that is below a threshold, in response to the identification of the candidate test, performing the candidate test, and providing, to a user, results of the performing of the candidate test.

20 Claims, 5 Drawing Sheets

(56) References Cited

U.S. PATENT DOCUMENTS

| | | | | |
|---|---|---|---|---|
| 9,251,019 | B2* | 2/2016 | Losh | G06F 11/2053 |
| 10,679,390 | B1* | 6/2020 | Solgi | G06N 7/01 |
| 2004/0018480 | A1* | 1/2004 | Patz | G09B 7/00 |
| | | | | 434/323 |
| 2004/0225653 | A1* | 11/2004 | Nelken | G06N 5/022 |
| | | | | 707/999.005 |
| 2007/0294201 | A1* | 12/2007 | Nelken | G06F 16/20 |
| | | | | 706/60 |
| 2013/0326269 | A1* | 12/2013 | Losh | G11C 16/349 |
| | | | | 714/6.13 |
| 2015/0164430 | A1* | 6/2015 | Hu | A61B 5/681 |
| | | | | 600/595 |
| 2015/0327208 | A1* | 11/2015 | Qiu | H04W 4/02 |
| | | | | 455/456.1 |
| 2016/0148850 | A1* | 5/2016 | David | G03F 7/70633 |
| | | | | 355/53 |
| 2017/0109646 | A1* | 4/2017 | David | G03F 7/70625 |
| 2018/0024918 | A1* | 1/2018 | Agarwal | G06F 3/048 |
| | | | | 717/125 |
| 2018/0063128 | A1* | 3/2018 | Korus | G06F 21/40 |
| 2020/0226162 | A1* | 7/2020 | Klatt | G06F 16/3329 |
| 2021/0141888 | A1* | 5/2021 | Hires | H04L 9/3231 |
| 2021/0328598 | A1* | 10/2021 | Annamraju | H03M 13/43 |

* cited by examiner

REGRESSION TESTING BASED ON OVERALL CONFIDENCE ESTIMATING

RELATED APPLICATION

This application claims priority to U.S. Provisional Application No. 62/986,048 titled REGRESSION TESTING BASED ON OVERALL CONFIDENCE ESTIMATING, filed on 6 Mar. 2020.

TECHNICAL FIELD

The technology disclosed relates to performing regression testing on products, such as computer code. In particular, the technology disclosed relates to determining confidence scores for candidate tests and performing those candidate tests having insufficient confidence scores prior to performing a full regression test session.

BACKGROUND

Regression testing is implemented to ensure quality and completeness of various types of projects (e.g., to ensure the quality of code for software projects) during development. Regression testing is performed by running tests from predefined or random test sets. Tests can be defined for projects related to developing executable code, like common software development, hardware description language (HDL) hardware prototyping, math modeling, etc. The result of running one individual regression test is either pass, some predefined fail state or system failure (e.g., test was not able to be completed, test failed because of network problems, exceeded quota, etc.). The goal of regression testing is to check the correctness and quality of the code (or other items, such as modules, specification, features, safety, completeness, performance, behavior, etc.) being tested. This process can be described as running some number of tests called to check/verify as many functional requirements and different cases as possible with respect to the code (or, for example, the other items descried above). During the development of a project, there is typically a need to run a large number of tests (e.g., thousands of tests than can take several hours or more) to obtain a product of high quality. This large number of tests requires many resources, which are generally limited. For example, development methodologies assume that new code cannot be integrated into the project before regression testing. Every change in the code can require at least one run (usually more than one) of the regression testing. Therefore, significant time and computational resources can be required in order to perform regression testing, as code is often changed many times during development. As a consequence, developers need to wait to obtain the results from a regression test or test suites (i.e., feedback from the regression test) before they can move to their next stage of development. This decreases the speed and increases the computational and financial costs of the development.

SUMMARY

Reducing the amount of time it takes to perform regression testing and reducing the amount of time that a developer waits to receive feedback from regression testing will greatly reduce the time and resources required to validate projects (e.g., software code, HDL code, Verilog code, etc.). The technology disclosed can reduce the amount of time it takes to perform the regression testing and the amount of time that the developer waits for feedback by estimating the results of some of the regression tests (e.g., candidate tests) without actually running the regression tests. By estimating the results, the developer will not need to wait for a full regression testing session, which includes many tests, and the developer can proceed to the next stage of development for the portions of the project for which the results of the regression test can be estimated. Specifically, the technology disclosed can determine which candidate tests can be performed without waiting for the full regression testing by using confidence estimates (e.g., confidence scores) for each test and various subsets of tests. This approach can be based on a set of confidences of various tests individually and collectively. Confidence estimates (e.g., confidence scores) can be a measure of how accurately test results can be predicted given some historical information. Candidate tests having high sufficiently high confidence scores do not need to be performed, as their results can be accurately predicted and candidate tests having insufficient confidence scores can be performed to determine their results (without waiting for the feedback of a full regression testing session).

The technology disclosed can use the confidence scores to identify certain tests that are likely to pass. Then, tests to be performed can be chosen in a way to maximize confidence scores of other tests. Also, failing of some tests can increase confidence in the failing of similar tests. Therefore, those tests for which the confidence score indicates that they are likely to fail do not need to be performed, because the system is confident enough that they will fail. If there are no failures for those certain test, the user can be notified that some number of the tests has passed, and the system is confident enough that certain other tests will pass as well. Also, if there are some failures in the tests, then the system can provide feedback to the user with a representative set of tests, which cover as many error types as possible.

The technology discloses can achieve these results by implementing a confidence estimation-based regression system. A confidence estimator can provide a confidence score indicating a level of assurance that tests (individually or collectively as a subset) will finish with predicted results. Using the confidence scores along with other resource constraints, the technology disclosed can choose an order in which particular tests will run. In order to achieve this, the technology disclosed can implement user predefined goals and results of previously finished tests. Specifically, the technology disclosed can iteratively choose a next test to run using adaptive criteria (based on results of previously ran tests) which maximizes expected overall confidence estimates on all tests using information including code changes and already obtained results of finished tests.

As a result, the user can obtain information that indicates whether the new code does or does not cause failures with a certain level of confidence. The technology disclosed can achieve these results using a method, a system and a non-transitory computer readable recording medium having computer instructions recorded thereon.

The technology disclosed describes a method of testing a product using confidence estimates. Specifically, the method can include identifying a set of candidate tests for testing the product and estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product. The estimating can include determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed. The method can further include identifying at least one of (i) a candidate test and (ii) a subset of candidate tests having a confidence score that is below a confidence score threshold, in response to the identification of the at least one of the candidate test and the subset having the confidence score that is below the confidence score threshold, performing the at least one of the candidate test and the subset of candidate tests, and providing, to a user, results of the performing of the at least one of the candidate test and the subset of candidate tests.

Furthermore, the estimating can further include determining, for each candidate test of the set of candidate tests, a probability of failure in dependence upon at least one of new change data regarding new changes to the product since a previous estimation or regression test has been performed for the product, calculating the confidence score for each respective candidate test in dependence upon (i) the determined probability of failure of the corresponding candidate test and (ii) previous or other test results that are related to the corresponding candidate test and that will affect test results of the corresponding candidate test or evidence related to progress of regression testing of the corresponding candidate test, and calculating, as the confidence score for the at least one subset of candidate tests, a mutual confidence in dependence upon (i) the determined probability of failure of each of the candidate tests in the subset of candidate tests and (ii) previous test results related to each of the candidate tests in the at least one subset of candidate tests.

In addition, the calculating of the confidence score for each respective candidate test can include calculating, as the confidence score of at least one candidate test, a conditional confidence score in dependence upon previous test results of other candidate tests of the set of candidate tests.

The calculating of the confidence score for the at least one subset can also include calculating, as the confidence score for the at least one subset, a mutual conditional confidence score in dependence upon previous test results of other candidate tests of the set of candidate tests.

The previous test results can include test results from at least one of (i) previous regression testing and (ii) at least one of previous confidence scores and previously determined probabilities of failure.

Moreover, the probability of failure can be determined for each candidate test according to, for example, one or more of Shannon entropy, Bayes theorem and Markov chain.

The method can further include determining that a probability of failure is within a particular range for a particular candidate test, and setting the confidence score to a value that indicates failure of the particular test as a result of the probability of failure being within the particular range, regardless of previous test results of or related to the particular test.

Additionally, the estimating can determine confidence scores for multiple subsets of candidate tests of the set of candidate tests. The method can further include identifying a most helpful subset of candidate tests that includes candidate tests and one or more subsets of candidate tests determined to be influential and related to other candidate tests of the set of candidate tests, determining a sequence for performing the candidate tests and the multiple subsets of candidate sets on the product, such that the candidate tests and the one or more subsets of candidate tests included in the most helpful subset of candidate tests are to be performed before the other candidate tests of the set of candidate tests, and performing the candidate tests and the multiple subsets of candidate tests according to the determined sequence.

The performing of the candidate tests and the multiple subsets of candidate tests can further include (i) performing a portion of the candidate tests and the multiple subsets of candidate tests, (ii) determining results of the performed portion, (iii) updating the confidence scores of other candidate tests and subsets of candidate tests in dependence upon the results of the performed portion and (iv) performing the other candidate tests and subsets of candidate tests using the updated confidence scores.

Furthermore, the determining of the sequence can determine the sequence such that a portion of the candidate tests and subsets of the candidate tests can be performed in parallel.

The performing of the at least one of the candidate test and the subset of candidate tests can be performed prior to performing regression testing on the portion of the product. The method can further include identifying which of the candidate tests and the at least one subset of candidate tests passed or fails in dependence the correspondence confidence scores and the confidence score threshold, providing information regarding the candidate tests and the at least one subset of candidate tests that pass to the user, and providing information regarding the candidate tests and the at least one subset of candidate tests that fail to a regression testing system for the regression testing of the product.

The product can be Hardware Description Language (HDL) code, Verilog code, SystemC code and/or software code and the set of candidate tests provides different inputs to the software code. The product can be implemented in an Electronic Design Automation (EDA) solution.

Each candidate test of the set of candidate tests can be configured to test one or more particular features of the product.

The technology disclosed can further include a non-transitory computer readable recording medium having computer instructions recorded thereon. The computer instructions, when executed on one or more processors, can cause the one or more processors to implement various operations. The operations can include identifying a set of candidate tests for testing the product and estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product. The estimating can include determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed. The operations can further include identifying at least one of (i) a candidate test and (ii) a subset of candidate tests having a confidence score that is below a confidence score threshold, in response to the identification of the at least one of the candidate test and the subset having the confidence score that is below the confidence score threshold, performing the at least one of the candidate test and the subset of candidate tests, and providing, to a user, results of the performing of the at least one of the candidate test and the subset of candidate tests.

The technology disclosed can further include a system including a memory storing computer instructions and one or more processors configured to execute the computer instructions to implement operations. The operations can include identifying a set of candidate tests for testing the product and estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product. The estimating can include determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed. The operations can further include identifying at least one of (i) a candidate test and (ii) a subset of candidate tests having a confidence score that is below a confidence score threshold, in response to the identification of the at least one of the candidate test and the subset having the confidence score that is below the confidence score threshold, performing the at least one of the candidate test and the subset of candidate tests, and providing, to a user, results of the performing of the at least one of the candidate test and the subset of candidate tests.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to regression testing based on overall confidence estimating.

Quality management is a discipline for ensuring that outputs, benefits and the processes by which they are delivered meet stakeholder requirements. For software development, hardware development and engineering projects related to coding or scripting (for example, in hardware design development) there are different types of quality testing. These types of quality testing can include various steps that may differ from project to project. However, quality management generally implements regression testing for most types of projects.

Regression testing is the process of checking code correctness and quality. This process can be described as running some number of tests called to check as many functional requirements and different cases as possible.

Regression testing can be performed each time a developer makes a change in code (e.g., updating code, adding new code, removing code, etc.). After making the change in the code, the developer will need to wait to receive feedback from a full regression testing session in order to move forward in the development of their project. This takes time, as the feedback from the full regression testing session is not immediately available because the full regression testing session needs to be scheduled, setup and then performed. This delay in the feedback from the regression delays development time and increases computational and financial costs.

The technology disclosed can reduce the amount of time it takes to perform the regression testing and the amount of time that the developer waits for feedback by estimating the results of some of the regression tests without actually running the regression tests. Then the developer can move to the next phase of development for portions of the code that pass the tests without waiting for the full regression test.

The technology disclosed can solve the above-described problems using an adaptive strategy that includes: (i) identifying candidate tests or subsets of candidate tests that have confidence scores that indicate that the candidate tests or subsets of candidate tests are likely to pass, (ii) after running each candidate test or subset of candidate tests, re-estimating probabilities and confidence scores of the results of the tests, and (iii) rescheduling some or all of the candidate tests or subsets of candidate tests. Moreover, the technology disclosed can estimate an overall confidence of the remaining tests (or a subset of the remaining tests), and if confidence is high enough, then remaining tests can be postponed, for example, for a nightly/periodic build. This adaptive solution allows earlier feedback to be obtained and provided to the developer.

Figure 1:
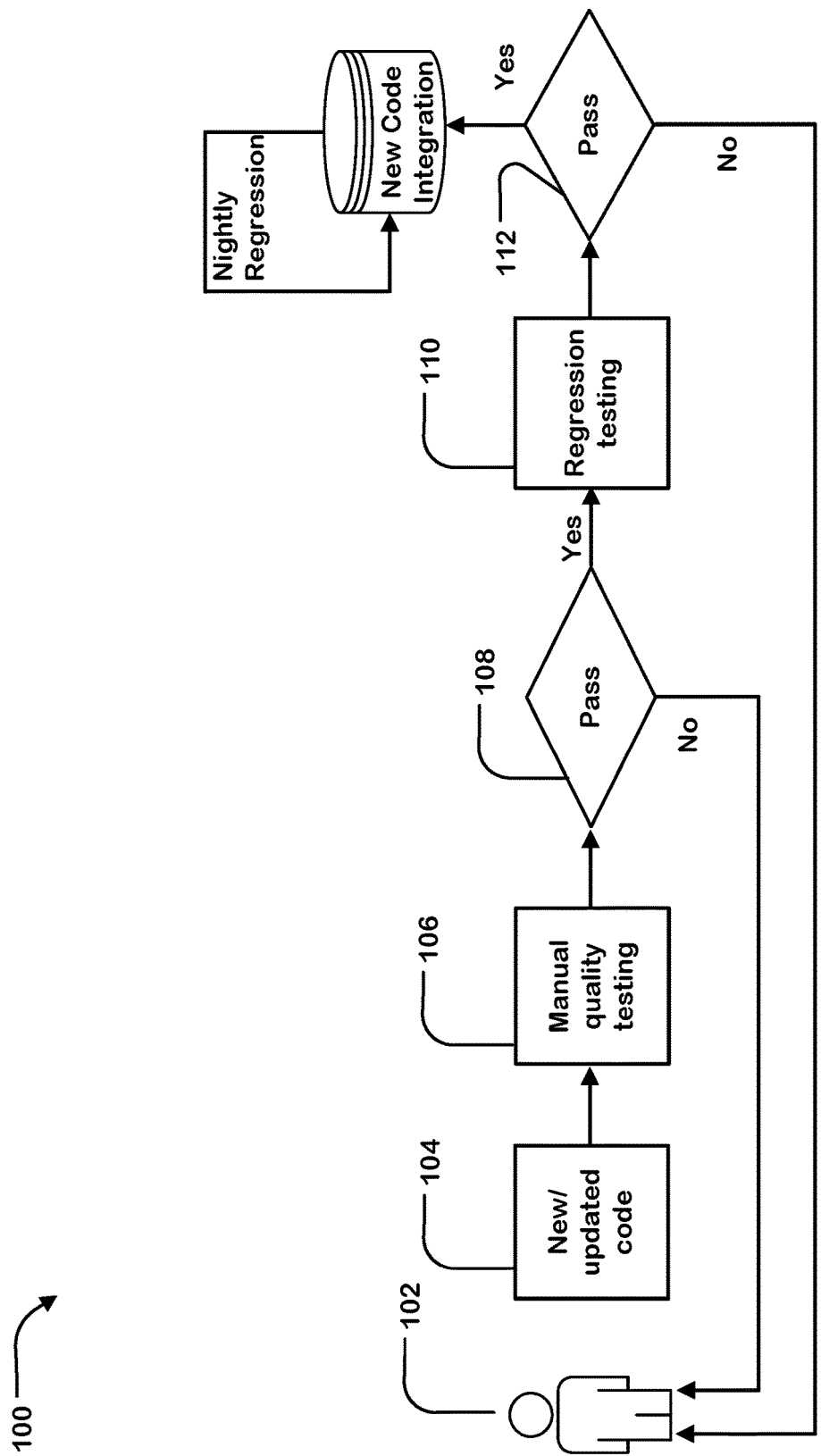
FIG. 1 illustrates the use of regression testing without use of an adaptive strategy.

FIG. 1 illustrates the use of regression testing without the use of the adaptive strategy. Specifically, FIG. 1 illustrates a flow chart 100 that represents a high level description of the development and testing of code.

According to FIG. 1, a user (developer) 102 will develop new code or updated code 104. Manual quality testing 106 can be performed on the code. This can be referred to as "sanity testing" and can include techniques such as unit testing, manual code running, running a small subset of regression tests, etc. If the manual quality testing 106 does not pass in operation 108, the results are passed back to the user 102. If the manual quality testing 106 passes in operation 108, then a full regression testing session 110 can be performed. At this point, the user 102 will need to wait for the full regression testing session 110 to complete in order to receive feedback. This waiting for the full regression testing session 110 to complete takes significant time, during which the user 102 is not able to move onto the next step of development. After the full regression testing session 110 is complete, the user 102 will be notified which particular tests passed and/or failed during the full regression testing session 110 fails (see operation 112). The user 102 can then consider the particular tests that failed and determine how to correct the code. The portions of the code that have passed the regression tests can, in operation 112, be sent to new code integration for a nightly regression. A nightly regression can run all tests with the latest (or separately will a recent changes) code base. A nightly regression can run more tests that the full regression testing session 110 or it can run the same number of tests. For example, the nightly regression can run a large number of tests on read designs and the running of these tests can take a long time for each change and/or check-in. Nightly regression tests can be more comprehensive and check the performance on different platforms and options that are available.

As previously explained, the regression testing 110 consumes much time and resources in an unoptimized way, drastically hinders the speed of development. The technology disclosed enables regression testing feedback time reduction based on the overall confidence estimation. This shortens the feedback time using intelligent candidate test selection based on regression testing historical data.

Figure 2:
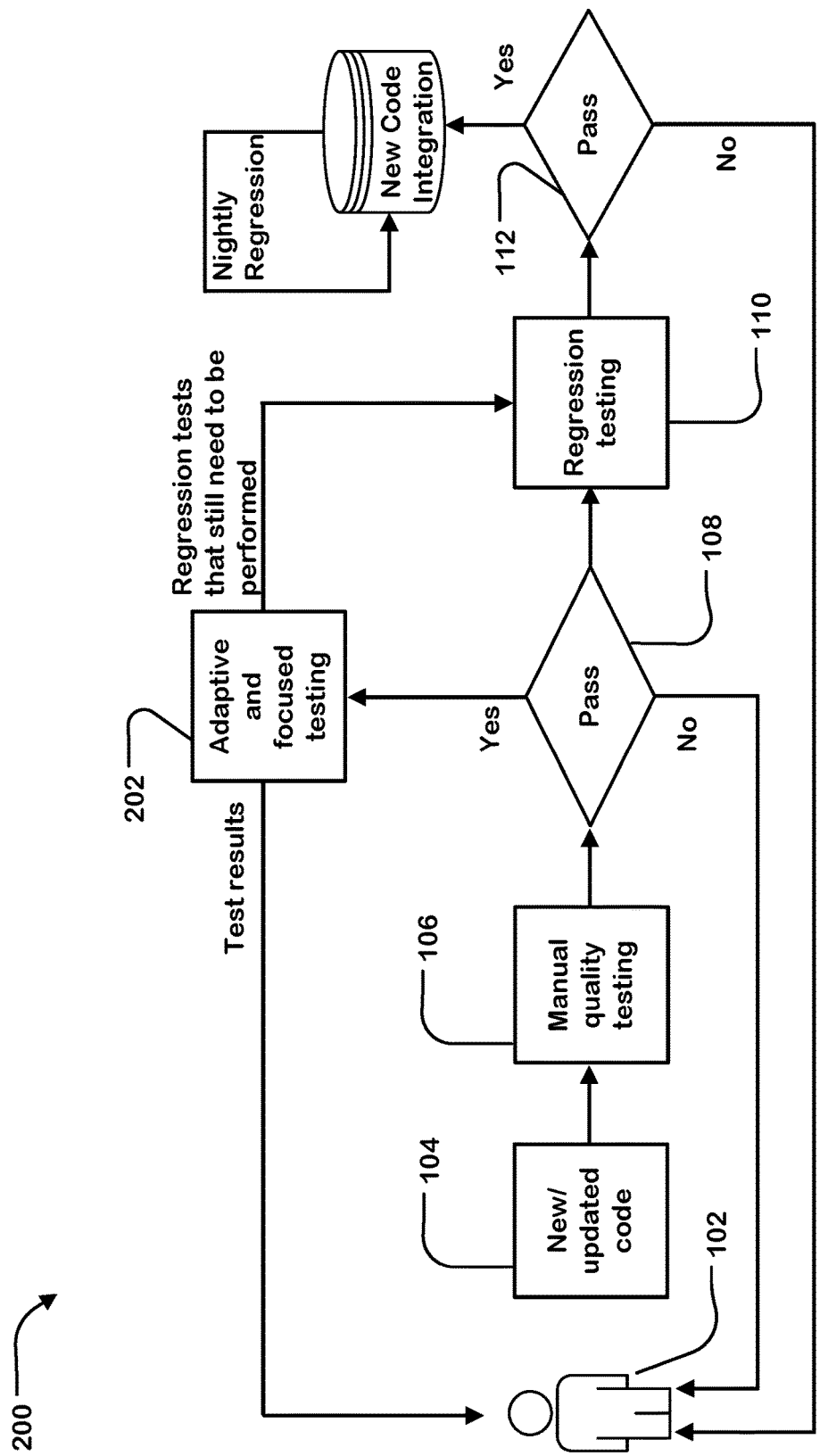
FIG. 2 illustrates the use of regression testing with the use of the adaptive strategy that is implemented before regression testing, according to an embodiment of the technology disclosed.

FIG. 2 illustrates the use of regression testing with the use of the adaptive strategy that is implemented before regression testing. Specifically, FIG. 2 illustrates a flow chart 200 that represents a high level description of the use of the adaptive strategy that is implemented before the regression testing.

FIG. 2 is similar to FIG. 1, except that after the manual quality testing 106 is performed, code that passes in operation 108 proceeds to adaptive and focused testing 202. As described in more detail below, candidate tests and subsets of candidate tests are identified and probabilities and confidence scores are determined for the candidate tests and the subsets of candidate tests. The candidate tests and subsets of candidate tests having high enough confidence scores can then be performed on the code. Further, candidate tests to be performed can be chosen in a way to maximize confidence scores of other candidate tests. Also, failing of some candidate tests can increase confidence in the failing of similar candidate tests. Therefore, those candidate tests for which the confidence score indicates that they are likely to fail do not need to be performed, because the system is confident enough that they will fail. Based on the results of the performing of the tests and subsets of tests, test results are provided back to the user 102. Furthermore, the adaptive and focused testing 202 orders the performing of the tests and subsets of test in such a way that the results can be used to further update probabilities of failure and the confidence scores of the candidate tests and subsets of candidate tests than have not yet been performed. After the adaptive and focused testing 202 is complete, there will still be some tests that need a full regression testing session. The results of the full regression testing session 110 (or results of a partially performed regression testing session) can then be used to update the probabilities and confidence scores of other tests for the next iteration of code testing.

Example Implementations

The technology disclosed can be used in a regression testing platform, such as VC Execution Manager (EMAN), a software product from Synopsys, Inc. of Mountain View, Calif. A project that can be tested using the technology disclosed can be an electronic design automation (EDA) solution such as a simulator, as well as any software or hardware project. For example, a project can be a new chip design in Verilog, and a regression testing platform can run a simulator to check if the behavior of the chip design is as expected. Alternatively, a project can be a software project, and a regression testing platform can run the code with varying inputs.

A user of a regression testing platform such as EMAN can configure which tests need to be run for the project, and how it must be done (which program to run, which environment variables are needed to be defined, which input data should be used, etc.). Generally, EMAN works with a grid (an array of computing machines) and does all needed work to run tests in parallel. EMAN can be used to test hardware projects. Developers work on a Hardware Description Language (HDL) such as Verilog code and run significant number of tests (e.g., thousands of tests) that can take several hours or more. For instance, a particular test can be a simulation of a (predefined) scenario.

As discussed herein, the reduction of the time that it takes for the developer to obtain testing feedback can be achieved by running only certain tests (as opposed to all of the tests in full regression testing session). The technology disclosed provides techniques for selecting the certain tests than can be performed prior to the full regression testing session. For some projects more that one million tests can accumulate and as more tests are added the total regression runtime increases. The technology disclosed can reduce the number of tests by deciding to only run the most useful tests in the day-to-day development, then at the very end of a project (prior to release) then entire test list can be ran. These techniques for achieving these results are based on probabilities and confidence scores determined for individual candidate tests and subsets of candidate tests. Candidate tests and subsets of candidate tests can refer to a set of test cases of circuit design, or any HDL (Hardware Description Language) or software project. Each test can return some finite number of predefined results including pass and different types of fails (related to the different types of possible errors). Also, a test can crash. Pass is a good result (everything works as expected), all other results are not good. Values of a confidence (function) can depend on the history of previous test runs and results obtained previously (if any) in the actual run. This confidence score (function) can be defined as a measure of how good test results may be predicted given some historical information and latest changes (if any).

Confidence scores (functions) are discussed in detail below. Note that confidence scores (functions) are based on initial probabilities (probabilities of failure) determined for each candidate test and subsets of candidate tests. Initially, the confidence scores (functions) are described below followed by a description of how probabilities of failure can be determined.

Description of Confidence Scores (Functions)

Let T represent a finite set of all tests that are candidates (e.g., candidate tests) for regression testing of the project.

Let $c(t): T \rightarrow \mathbb{R}$ represent a real-valued confidence score (function) of any test $t \in T$.

Let $mc(\tau): 2^T \rightarrow \mathbb{R}$ represent a mutual confidence real-valued score (function) of any subset of tests $\tau \subseteq T$. This mutual confidence score (function) is a measure of what the confidence is believed to be for a subset of candidate tests. For example, assume that there are 100 candidate tests and a subset of candidate tests includes 10 of the 100 tests. Assume that the system has previous regression results for tests #1-9, but there are no previous results related to test #10 of the subset. The mutual confidence score (function) takes into account results of other tests within the "subset". Therefore, the confidence score can be determined for test

10 and the overall confidence score for tests #1-10 can be determined from what was known for tests #1-9.

Let R represent the finite set of all possible test results, for example, R={pass,fail}.

Let Res={(t,r)} represent the set of all partial regression results as the set of sets of pairs where each entry consists of t∈T and r∈R. Also, Tests(res)={t|(t,r)∈Res,r∈R} the set-value function of any res∈Res.

Let $c(t|res)$: (T,Res)→ ℝ represent a conditional confidence real-valued function (score) of some test t∈T given test results res∈Res. This conditional confidence score (function) allows the system to define a confidence score (function) for a particular test based on the results of other tests.

Let $mc(\tau|res)$: $(2^T,Res)$→ ℝ represent a mutual conditional confidence real-valued score (function) of any subset of sets $\tau \subseteq T$ given partial test results res∈Res. This mutual conditional confidence score (function) allows for a subset of candidate tests to have their confidence score (function) updated in dependence upon test results from other candidate tests and subsets of candidate tests that are outside of the subset of candidate tests.

Let $f(\tau|res)$: (T,Res)→ ℝ represent a scalarizing function (or value) of multiple objectives $f(f_{mc}(\tau|res), f_1(\tau|res), \ldots, f_n(\tau|res))$ (e.g., weighted sum), where $f_{mc}(\tau|res)$ denotes the estimation function of $mc(T\backslash(\tau \cup Test(res))|res)$, $f_1(\tau|res), \ldots, f_n(\tau|res)$ denote the custom user objectives (e.g., minimizing resources usage, minimizing the time of obtaining test failures).

Determining Order of Confidence Tests

One approach for identifying an order of performing selected confidence tests is provided below in the following high-level algorithm:
1. Choose a subset $\Im_0 \subset T$ of tests that will run in the first order using c(t), mc(τ), and test running system constraints such that $f(\Im_0|\emptyset)$ is expected to be me maximal.
2. Run $\Im_0$ and let $\Re_0 \in Res$ equal to its results.
3. Let i=1, $\Im_\Sigma := \Im_0$, and $\Re_\Sigma := \Re_0$
4. While $T\backslash\Im_\Sigma \neq \emptyset$ and $mc(T\backslash\Im_\Sigma | \Re_\Sigma) \leq C^{min}$ do
   a. Choose the subset $\Im_i \subset T\backslash\Im_\Sigma$ which will run next using c(t| $\Re_\Sigma$), mc(t| $\Re_\Sigma$), and test running system constraints such that $f(\Im_i| \Re_\Sigma)$ is expected to be maximal.
   b. Run $\Im_i$ and let $\Re_i \in Res$ equals its results.
   c. Let $\Im_\Sigma := \Im_\Sigma \cup \Im_i$, $\Re_\Sigma := \Re_\Sigma \cup \Re_i$, and i:=i+1.

Candidate (regression) testing will not be performed on a candidate test having a confidence score that is higher than some predefined constant $C^{min}$ (e.g., a confidence score threshold) or alternatively, the candidate (regression) testing will or will not be performed on a candidate test that is within or outside of a particular range (e.g., confidence score range). This provides the ability to reduce regression feedback and obtain the most meaningful information on tests passing in the first order. Further behavior of the system can be set up by user, e.g., finish regression, continue in the shadow mode, etc.

A regression testing platform can work with two types of data: data which is known at the beginning of a regression testing run, such as a user who runs it, changes of code in the design, and so on, and data of already run tests (which can be pass and fail). Learned estimators (those created with a previous machine learning flow) can create estimations of test results before the start of the candidate regression run, and also the estimations can be changed on updates of the current candidate regression testing run. For example, some user "U" wants to run the candidate regression for his/her changes in the design, learned estimators produce initial confidences of the tests' results, but after the first tests finish with some concrete results, estimators can change these confidences. For example, initially the system had estimation of Test N's pass score equal to 0.6, but when Test M was passed, the estimator can increase Test N's estimation of the pass score to 0.9.

Using Calculated Probabilities to Influence Confidence Scores (Functions)

A problem encountered by control regression flow can be formulated as follows. Let T reflect the finite set of all tests in the regression of the project. Let R reflect the finite set of all possible test results. A probability distribution P(t∈T will finish with result r∈R) can be defined for every test. This can be done using the Bayesian approach to probability, i.e., such distribution will be treated as a quantification of one's belief. The control of the regression flow problem can be formulated as follows: find an algorithm that will interactively find a subset of tests $\tau \subseteq T$ and ordering on τ to maximize the summary confidence on T in terms of P.

Some algorithms provide a static list of tests or estimations of tests' failing probability before a candidate regression run. Such algorithms are based on historical, coverage, and change data for the prediction and decision making. Algorithms implemented by the technology disclosed use the same data to estimate the initial probability (of failure) and rely on running sessions to continually improve the probability of failure based on results of candidate tests performed before a full regression testing session and also based on results of a full regression testing session.

Overall Example Implementation of Technology Disclosed

The technology disclosed can implement an algorithm that considers (i) new changes to the project (e.g., code), referred to as NewChangesData, and (ii) information regarding the user/developer, referred to as UserInfo. Specifically, NewChangesData can identify code/features that have changed in the project since making a prior estimation or performing a prior regression test. Furthermore, UserInfo can include information about the user/developer who has made the changes or who has approved the code changes. Historical information about the user/developer can be stored, such as past success or failure of code modifications by the particular user/developer. For example, if previous code changes from a particular user have a 90% failure rate, then the 90% failure rate is factored into the confidence score. Further, the failure rate of the particular user can be considered relative to the size of the previous changes, what part of the code the changes are related to (e.g., a concrete portion of the code) and the size of the current change. The algorithm can be implemented as follows:
1. Create an empty dictionary (hash table) ProbToFail;
2. For each test t in the set of all tests T:
   a. Calculate probability of failing test t using the NewChangesData and the UserInfo, as ProbToFail. Pseudo code for calculating the probability of failing test t can be as follows:
   CalculateProbToFailInit(NewChangesData, UserInfo);
   b. Calculate c(t), mc(τ) functions (scores) using ProbToFail. Note that c(t), mc(τ) do not necessarily equal ProbToFail for a particular test, because they are computed differently. For example, the probability to fail for test #1 can 0.1, c(t), mc(τ) can then be used to calculate a deterministic function (score) to come up with an estimation of the confidence. Then c(t), mc(τ) can be scaled. If ProbToFail, for example, is between 0.3 and 0.7, then the confidence function (score) can be 0, regardless of the historical confidence scores for c(t), mc(τ). There can be, for example, a threshold with respect to the ProbToFail that defaults to a confidence score of 0. This can also work the other way, if ProbToFail is very high (above a certain threshold), then the confidence score dan default to 100% (e.g., pass). Further, note that conditional confidences are not used at this stage because there is no data about the other tests. The next time this estimation process is performed, the conditional confidences can be calculated and used, as discussed below.

3. Choose the subset $\mathfrak{I}_0 \subset T$ of tests that will run in the first order using c(t), mc(τ), and test running system constraints such that $f(\mathfrak{I}_0|\emptyset)$ is expected to be maximal. This can be summarized as, for example, finding tests that will the most likely maximize the accuracy of the confidence scores of other tests (e.g., which candidate tests will be the most helpful in determining results in subsequent other tests). Example: three tests, #1 (which tests feature 1), #2 (which tests feature 2) and #3 (which tests features 1 and 2). If test #3 passes, tests #1 and #2 will almost certainly pass or if test #3 fails, then almost certainly one of tests #1 and #2 will fail. Test #3 is "maximal" or "more helpful" because it can influence (be influential to) the outcomes and help increase the accuracy of other tests. Therefore, test #3 should be ran first. In this step, the system identifies the tests that will be "more helpful" than other tests, such that the "more helpful" tests can be performed at the beginning.

4. Query how many new tests can be started in the first order and save this number in variable testsToRun. This step can decide which, if any, tests can be ran in parallel. This can be based on an estimated time that it will take to compete the candidate tests. This can help identify the most efficient way to run the candidate tests to maximize time efficiency.

5. Run $\mathfrak{I}_0$ and let $\mathfrak{R}_0 \in$ Res equal to its results. This step includes running a subset of candidate tests and waiting for test results (results of one or more tests).

6. Let i=1, $\mathfrak{I}_\Sigma:=\mathfrak{I}_0$, and $\mathfrak{R}_\Sigma:=\mathfrak{R}_0$. This step assigns variables to the tests.

7. While $T\backslash\mathfrak{I}_\Sigma\neq\emptyset$ and mc($T\backslash\mathfrak{I}_\Sigma|\mathfrak{R}_\Sigma$)≤$C^{min}$ do:
   a. Query how many new tests can be started and save this number in variable testsToRun;
   b. Choose the subset $\mathfrak{I}_i \subset T\backslash\mathfrak{I}_\Sigma$ such that $|\mathfrak{I}_i|$≤testsToRun and $f(\mathfrak{I}_i|\mathfrak{R}_\Sigma)$ is maximal;
   c. Run $\mathfrak{I}_i$ and let $\mathfrak{R}_i\in$ Res equals its results;
   d. Let $\mathfrak{I}_\Sigma:=\mathfrak{I}_\Sigma\cup\mathfrak{I}_i$, $\mathfrak{R}_\Sigma:=\mathfrak{R}_\Sigma\cup\mathfrak{R}_i$, and i=i+1;
   e. Update ProbToFail dictionary using $\mathfrak{R}_\Sigma$, ProbToFail=CakulateProbToFail(NewChangesData, UserInfo, $\mathfrak{R}_\Sigma$);
   f. Calculate c(t), mc(τ) functions using ProbToFail. This iteration performed by step 7 sets the conditions for loops, where results of tests that are currently run in this particular estimation can be used to update the ProbToFail, which in turn updates the c(t), mc(τ) for other tests. This provides real time feedback of current results to make subsequent results in the same "estimation" more accurate.

Defining Confidence Scores (Functions)

Herein a description is provided to demonstrate how the functions (scores) c(t), mc(τ), c(t|res), mc(t|res), f(τ|res), CalculateProbToFailInit and CalculateProbToFail can be defined. The technology disclosed is not limited to the descriptions provided below.

One way to define confidence is to define it using Shannon entropy as $$c(t) = -H(t) = \sum_{r \in R} P_{t,r} \cdot \log P_{t,r} = \mathbb{E}_P[\log P_t]$$

where $P_r$=P(t will finish with result r), $P_t$ is the probability distribution of results of test t, and logarithm can have any fixed base. Other types of entropy calculations can also be implemented.

Similarly, mc(τ)=−H(τ);

c(t|res)=−H(t|res)

=−H(t|$t_1$ finished with result $r_1$, ... ,$t_n$ finished with result $r_n$); and mc(τ|res)=−H(τ|res)

To calculate initial estimations of all $P_r$, e.g., a function CalculateProbToFailInit can use any relevant historical data on regression runs. To create such estimations, any relevant Machine Learning algorithm can be used, such as Logistic regression, Random Forest, Multilevel Perceptron with sigmoid output level, etc. For each project, there can be a predefined set of tests that can be used by a regression testing platform, such as EMAN, for a regression run. A regression testing platform can run a machine learning flow on some schedule (for example, every night, every week, etc.), to update an estimator that calculates the estimations. At the beginning of a regression run, a regression testing platform can use an estimator from a previous machine learning flow.

The probability estimator of CalculateProbToFailInit can be defined as the Random Forest algorithm due to its insensitivity to the data preprocessing procedure.

CalculateProbToFail can update $P_t$ estimations using the results of the tests finished in the running Regression Testing session. One approach to obtain the model which can be updated with partial data is to use, for example, Bayes or Markov probabilistic nets.

Figure 3:
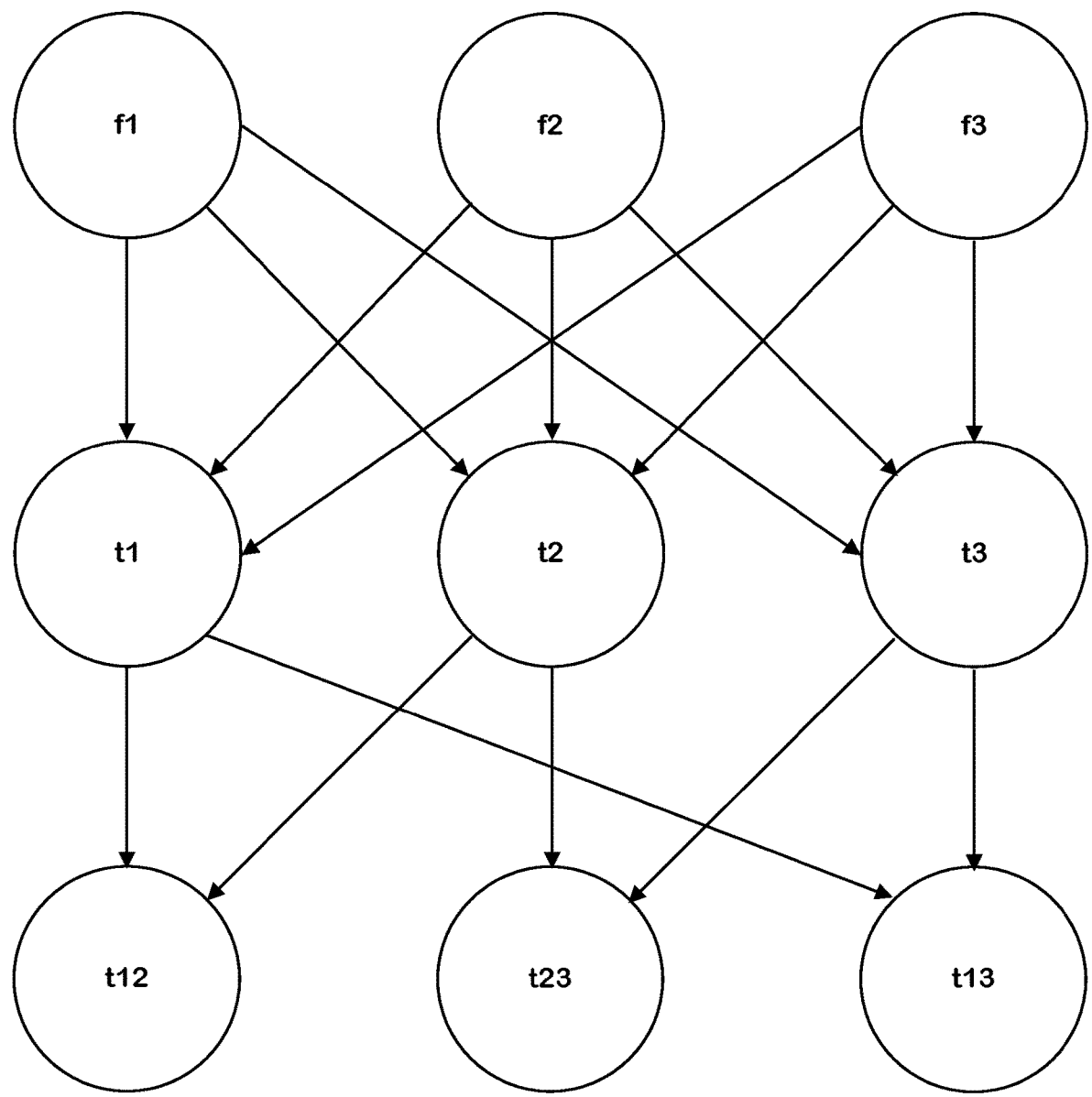
FIG. 3 illustrates an example Bayes net for a situation with three features and three tests, according to an embodiment of the technology disclosed.

FIG. 3 illustrates an example of using Bayes net to obtain a model which can be updated with partial data.

FIG. 3 illustrates an example Bayes net for a situation with three features and three tests. There are three types of nodes (random variables): features, tests, and pairwise test correlations. Features are some info from NewChangesData and UserInfo. Test nodes correspond to the real tests, and pairwise correlations are defined as random variables, which indicates the result of both tests. There are directed connections from each feature node (e.g., f1, f2, f3) to each test node (t1, t2, t3), and there are direct connections from each test node (t1, t2, t3) to pairwise tests nodes (e.g., t1 to t12 and t13; t2 to t12 and t23; and t3 to t23 and t13).

As illustrated in FIG. 3, this model has $O(n^2)$ nodes and three layers. The learning itself can be done using a standard expectation-maximization (EM) algorithm or other types of probabilistic models or algorithms. Using such Bayes model, it can be queried as P($t_i$ will finish with result $r_j$|res).

To perform such queries, Belief Update algorithms or other types of probabilistic models or algorithms can be used, for example. Since features depend on NewChanges- Data and UserInfo, they will not change during the regression testing session. So, for each test status change, the query can be performed at most O(n) operations.

Function $f$ can be arbitrary but suitable for undergoing optimization. For example, $f$ can be defined as $$f(\tau \mid res) = \max_{\tau \backslash Tests(res)} \{|P_{t,r} - 0.5|\}.$$

This is a simplified setup, and can be calculated using a simple "greedy" algorithm. The algorithm can then be formulated for the case of function definitions as follows:
1. Create an empty dictionary (hash table) ProbToFail;
2. For each test t in the set of all tests T:
   a. Calculate the probability of failing test t using pre-trained corresponding Random Forest model;
   b. Calculate $-H(t)$, $-H(\tau)$ functions using Belief Propagation algorithm;
3. Choose the subset $\mathfrak{I}_0 \subset T$ of tests that will run in the first order such that $$\max_T \{|P_{t,r} - 0.5|\}$$

is expected to be me maximal;
4. Query how many new tests can be started in the first order and save this number in variable testsToRun;
5. Run $\mathfrak{I}_0$ and let $\mathfrak{R}_0 \in$ Res equal to its results;
6. Let i=1, $\mathfrak{I}_\Sigma := \mathfrak{I}_0$, and $\mathfrak{R}_\Sigma := \mathfrak{R}_0$;
7. While $T \backslash \mathfrak{I}_\Sigma \neq \emptyset$ and $-H(T \backslash \mathfrak{I}_\Sigma \mid \mathfrak{R}_\Sigma) \leq C^{min}$ do:
   a. Query how many new tests can be started and save this number in variable testsToRun;
   b. Choose the subset $\mathfrak{I}_i \subset T \backslash \mathfrak{I}_\Sigma$ such that $|\mathfrak{I}_i|$ testsToRun and $$\max_{\mathfrak{I}_i \backslash Tests(R_\Sigma)} \{|P_{t,r} - 0.5|\}$$

is maximal;
   c. Run $\mathfrak{I}_i$ and let $\mathfrak{R}_i \in$ Res equals its results;
   d. Let $\mathfrak{I}_\Sigma := \mathfrak{I}_\Sigma \cup \mathfrak{I}_i$, $\mathfrak{R}_\Sigma := \mathfrak{R}_\Sigma \cup \mathfrak{R}_i$, and i=i+1;
   e. Update ProbToFail dictionary using $\mathfrak{R}_\Sigma$ and running Belief Propagation algorithm from each node corresponding to Tests( $\mathfrak{R}_\Sigma$); and
   f. Calculate $-H(t)$, $-H(\tau)$ functions using ProbToFail.

The constant $C^{min}$ can be defined as $C^{min} = -\alpha H^{max}(T)$ where $\alpha$ is user-defined constant corresponding to the desired level of confidence, $H^{max}(T)$ is the maximal entropy of the full set of tests without any information, such that $H^{max}(T) = \log(|R|^{|T|})$.

The results of the regression testing based on the overall confidence estimating models can be applied to design of a circuit, and to manufacturing of a circuit. Circuit design can be improved and optimized by using the results of the regression testing. Circuit layout can be improved and optimized by using the results of the regression testing. A computer system can output fabrication mask specifications developed in dependence upon the improved and optimized circuit design and circuit layout. A fabrication facility can manufacture integrated circuits using the fabrication mask specifications developed in dependence upon the regression testing.

Figure 4:
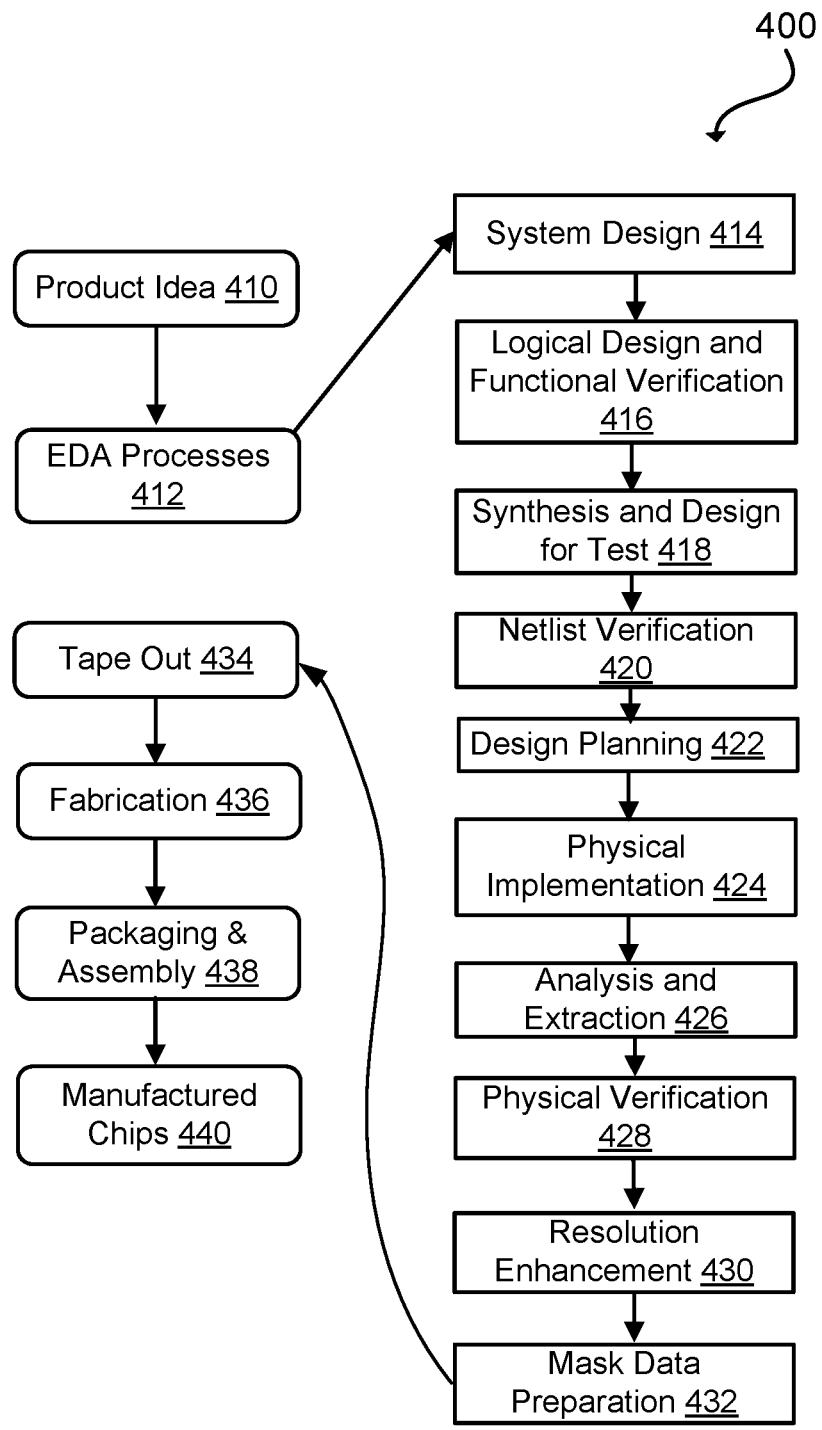
FIG. 4 depicts a flowchart of various processes used during the design and manufacture of an integrated circuit in accordance with some embodiments of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information which is transformed to create an article of manufacture that uses a set of EDA processes 412, which can include the candidate (regression) testing techniques described herein. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly processes 438 are performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described by be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
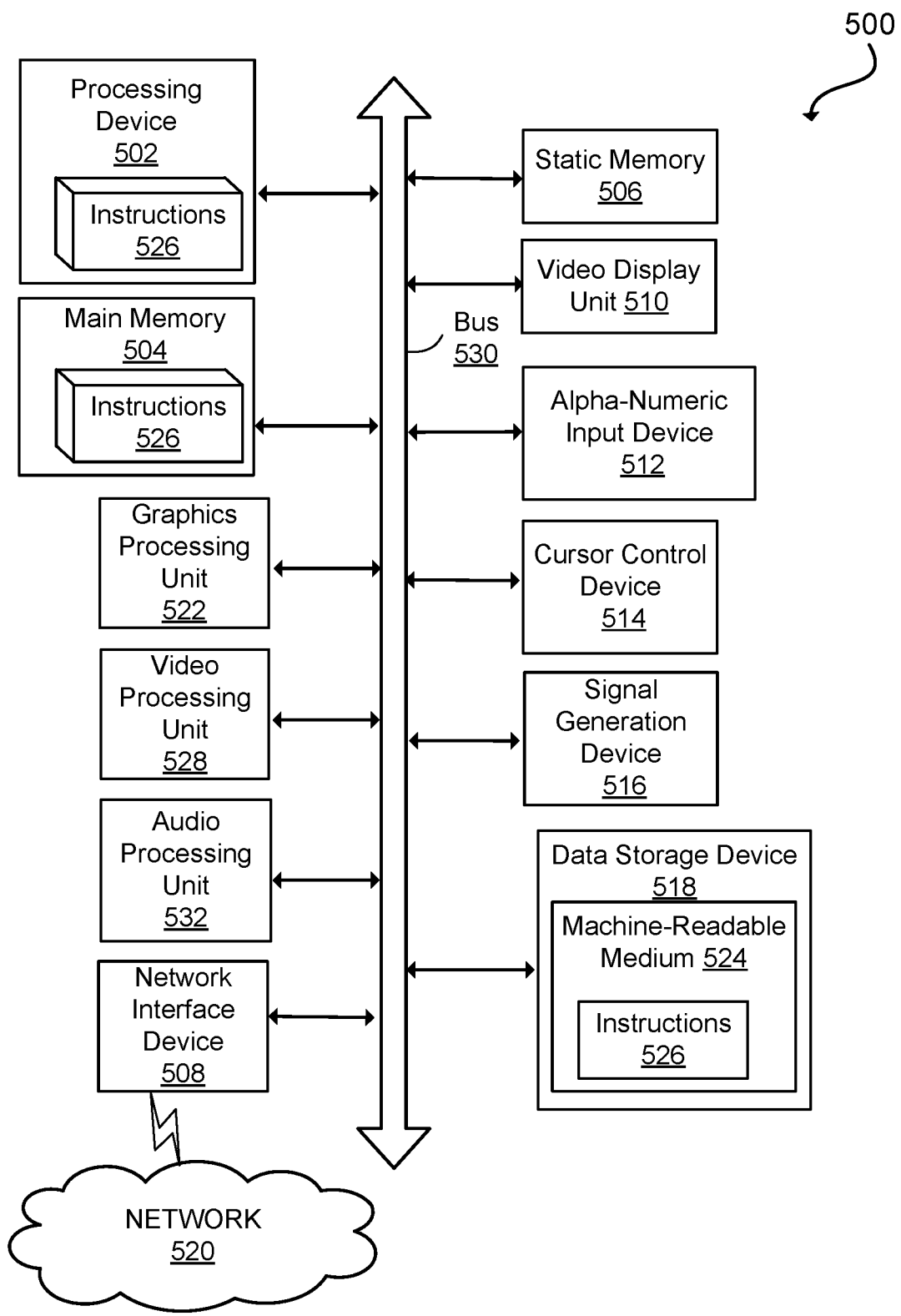
FIG. 5 depicts an abstract diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of testing a product using confidence estimates, the method comprising:
   identifying a set of candidate tests for testing the product;
   estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product, the estimating comprising:
      determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed;
   identifying at least one of (i) a candidate test and (ii) a subset of candidate tests having a confidence score that is below a confidence score threshold;
   in response to the identification of the at least one of the candidate test and the subset having the confidence score that is below the confidence score threshold, performing the at least one of the candidate test and the subset of candidate tests; and
   providing results of the performing of the at least one of the candidate test and the subset of candidate tests.

2. The method of claim 1, wherein the estimating further comprises:
   determining, for each candidate test of the set of candidate tests, a probability of failure in dependence upon at least one of new change data regarding new changes to the product since a previous estimation or regression test has been performed for the product; and
   calculating the confidence score for each respective candidate test in dependence upon (i) the determined probability of failure of the corresponding candidate test and (ii) previous or other test results that are related to the corresponding candidate test and that will affect test results of the corresponding candidate test or evidence related to progress of regression testing of the corresponding candidate test.

3. The method of claim 2, further comprising calculating, as the confidence score for the at least one subset of candidate tests, a mutual confidence in dependence upon (i) the determined probability of failure of each of the candidate tests in the subset of candidate tests and (ii) previous test results related to each of the candidate tests in the at least one subset of candidate tests.

4. The method of claim 2, wherein the calculating of the confidence score for each respective candidate test includes calculating, as the confidence score of at least one candidate test, a conditional confidence score in dependence upon previous test results of other candidate tests of the set of candidate tests.

5. The method of claim 2, wherein the calculating of the confidence score for the at least one subset includes calculating, as the confidence score for the at least one subset, a mutual conditional confidence score in dependence upon previous test results of other candidate tests of the set of candidate tests.

6. The method of claim 2, wherein the previous test results include test results from at least one of (i) previous regression testing and (ii) at least one of previous confidence scores and previously determined probabilities of failure.

7. The method of claim 2, wherein the probability of failure is determined for each candidate test according to one or more of Shannon entropy, Bayes theorem and Markov chain.

8. The method of claim 2, further comprising:
determining that a probability of failure is within particular range for a particular candidate test; and
setting the confidence score to a value that indicates failure of the particular candidate test as a result of the probability of failure being within the particular range, regardless of previous test results of or related to the particular candidate test.

9. The method of claim 1,
wherein the estimating determines confidence scores for multiple subsets of candidate tests of the set of candidate tests, and
wherein the method further comprises:
identifying a most helpful subset of candidate tests that includes candidate tests and one or more subsets of candidate tests determined to be influential and related to other candidate tests of the set of candidate tests;
determining a sequence for performing the candidate tests and the multiple subsets of candidate sets on the product, such that the candidate tests and the one or more subsets of candidate tests included in the most helpful subset of candidate tests are to be performed before the other candidate tests of the set of candidate tests; and
performing the candidate tests and the multiple subsets of candidate tests according to the determined sequence.

10. The method of claim 9, wherein the performing of the candidate tests and the multiple subsets of candidate tests includes (i) performing a portion of the candidate tests and the multiple subsets of candidate tests, (ii) determining results of the performed portion, (iii) updating the confidence scores of other candidate tests and subsets of candidate tests in dependence upon the results of the performed portion and (iv) performing the other candidate tests and subsets of candidate tests using the updated confidence scores.

11. The method of claim 9, wherein the determining of the sequence determines the sequence such that a portion of the candidate tests and subsets of the candidate tests can be performed in parallel.

12. The method of claim 1, wherein the performing of the at least one of the candidate test and the subset of candidate tests is performed prior to performing regression testing on the portion of the product.

13. The method of claim 12, further comprising:
identifying which of the candidate tests and the at least one subset of candidate tests passed or fails in dependence the correspondence confidence scores and the confidence score threshold;
providing information regarding the candidate tests and the at least one subset of candidate tests that pass to the user; and
providing information regarding the candidate tests and the at least one subset of candidate tests that fail to a regression testing system for the regression testing of the product.

14. The method of claim 1, wherein the product is Hardware Description Language (HDL) code.

15. The method of claim 1, wherein the product is SystemC code.

16. The method of claim 1, wherein the product is software code and the set of candidate tests provides different inputs to the software code.

17. The method of claim 1, wherein the product is implemented in an Electronic Design Automation (EDA) solution.

18. The method of claim 1, wherein each candidate test of the set of candidate tests is configured to test one or more particular features of the product.

19. A non-transitory computer readable recording medium having computer instructions recorded thereon, the computer instructions, when executed on one or more processors, cause the one or more processors to implementing operations comprising:
identifying a set of candidate tests for testing the product;
estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product, the estimating comprising:
determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed;
identifying at least one of (i) a candidate test and (ii) a subset of candidate tests having a confidence score that is below a confidence score threshold;
in response to the identification of the at least one of the candidate test and the subset having the confidence score that is below the confidence score threshold, performing the at least one of the candidate test and the subset of candidate tests; and
providing results of the performing of the at least one of the candidate test and the subset of candidate tests.

20. A system comprising:
a memory storing computer instructions; and
one or more processors configured to execute the computer instructions to implement operations comprising:
identifying a set of candidate tests for testing the product;
estimating a respective confidence score for (i) each candidate test included in the set of candidate tests and (ii) at least one subset of candidate tests from the set of candidate tests, the confidence scores reflecting a level of confidence that the corresponding candidate tests and the corresponding at least one subset of candidate tests will pass or fail when being performed on the product, the estimating comprising:
determining the respective confidence scores in dependence upon at least one of (i) previously obtained test results of the corresponding candidate test or the corresponding at least one subset of candidate tests, (ii) changes to the product since a previous estimation or regression test has been performed and (iii) information regarding a user who has made changes to the portion of the product since the previous estimation or regression test has been performed;

identifying at least one of (i) a candidate test and (ii) a subset of candidate tests having a confidence score that is below a confidence score threshold;

in response to the identification of the at least one of the candidate test and the subset having the confidence score that is below the confidence score threshold, performing the at least one of the candidate test and the subset of candidate tests; and providing results of the performing of the at least one of the candidate test and the subset of candidate tests.

\* \* \* \* \*